United States Patent
Inoue et al.

(10) Patent No.: US 10,164,202 B2
(45) Date of Patent: Dec. 25, 2018

(54) ORGANIC ELECTROLUMINESCENCE DEVICE INCLUDING AN ORGANIC ELECTROLUMINESCENCE ELEMENT ABOVE A CONTACT HOLE

(71) Applicant: Sharp Kabushiki Kaisha, Sakai, Osaka (JP)

(72) Inventors: Satoshi Inoue, Sakai (JP); Katsuhiro Kikuchi, Sakai (JP); Hideki Uchida, Sakai (JP); Eiji Koike, Sakai (JP); Masanori Ohara, Sakai (JP); Yuto Tsukamoto, Sakai (JP); Yoshiyuki Isomura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/566,253

(22) PCT Filed: Apr. 15, 2016

(86) PCT No.: PCT/JP2016/062131
§ 371 (c)(1),
(2) Date: Oct. 13, 2017

(87) PCT Pub. No.: WO2016/167354
PCT Pub. Date: Oct. 20, 2016

(65) Prior Publication Data
US 2018/0097195 A1 Apr. 5, 2018

(30) Foreign Application Priority Data

Apr. 16, 2015 (JP) ................. 2015-084359

(51) Int. Cl.
*H01L 51/50* (2006.01)
*H05B 33/06* (2006.01)
(Continued)

(52) U.S. Cl.
CPC ...... *H01L 51/5012* (2013.01); *H01L 27/3248* (2013.01); *H01L 27/3258* (2013.01);
(Continued)

(58) Field of Classification Search
None
See application file for complete search history.

(56) References Cited

U.S. PATENT DOCUMENTS

| | | | |
|---|---|---|---|
| 2001/0019133 A1 | 9/2001 | Konuma et al. | |
| 2006/0232203 A1 | 10/2006 | Noda | |
| 2015/0060832 A1* | 3/2015 | Ito | H01L 51/5225 257/40 |

FOREIGN PATENT DOCUMENTS

| | | | |
|---|---|---|---|
| CN | 204116747 U | | 1/2015 |
| JP | 2006221902 | * | 8/2006 |

(Continued)

OTHER PUBLICATIONS

Official Communication issued in International Patent Application No. PCT/JP2016/062131, dated Jul. 12, 2016.

*Primary Examiner* — Daniel Whalen
(74) *Attorney, Agent, or Firm* — Keating & Bennett, LLP

(57) ABSTRACT

An organic electroluminescence device according to one aspect of the present invention includes: a substrate; a thin film transistor provided above the substrate; a flattening layer provided above the thin film transistor and including a contact hole which is open on a side opposite to the substrate; a reflecting layer provided along at least a surface of the contact hole; a light-transmitting filling layer configured to fill an inside of the contact hole with the reflecting layer therebetween; and an organic EL element formed above the flattening layer and a contact hole top.

10 Claims, 11 Drawing Sheets

(51) Int. Cl.
*H05B 33/22* (2006.01)
*H05B 33/28* (2006.01)
*H01L 51/52* (2006.01)
*H01L 27/32* (2006.01)

(52) U.S. Cl.
CPC .......... *H01L 51/52* (2013.01); *H01L 51/5218* (2013.01); *H05B 33/06* (2013.01); *H05B 33/22* (2013.01); *H05B 33/28* (2013.01); *H01L 51/5271* (2013.01)

(56) References Cited

FOREIGN PATENT DOCUMENTS

| | | | |
|---|---|---|---|
| JP | 2006-303463 | A | 11/2006 |
| JP | 2010-287543 | A | 12/2010 |
| JP | 2010287543 | * | 12/2010 |
| JP | 2012-048992 | A | 3/2012 |
| JP | 2014-103117 | A | 6/2014 |

* cited by examiner

ORGANIC ELECTROLUMINESCENCE DEVICE INCLUDING AN ORGANIC ELECTROLUMINESCENCE ELEMENT ABOVE A CONTACT HOLE

TECHNICAL FIELD

One aspect of the present invention relates to an organic electroluminescence device.

Priority is claimed on Japanese Patent Application No. 2015-084359, filed Apr. 16, 2015, the content of which is incorporated herein by reference.

BACKGROUND ART

In the related art, organic electroluminescence (EL) elements (organic light-emitting diodes (OLEDs)) have been developed as candidates for next generation display technologies.

Organic EL elements are light emitting elements, and light emitting areas thereof are defined by open regions of insulating films referred to as edge covers. Since organic EL elements have extremely thin film thicknesses of 200 nm as a whole, elements cannot be formed in portions with large unevenness such as contact holes configured to join pixel electrodes and circuit wirings. For this reason, there is a problem of an increase in reduction of light emitting areas due to contact holes as definition becomes higher.

Contact holes need to have an external form size of about 10 μm due to a relationship between contact resistances of wirings and pixel electrodes. For this reason, light emitting areas are significantly reduced due to contact holes as the definition of panels becomes higher.

Furthermore, wall surfaces of contact holes are steeply formed. For this reason, when thin film organic EL elements are formed, upper electrodes and lower electrodes of the organic EL elements may be short-circuited and pixel defects may occur without light being emitted in some cases.

Patent Document 1 discloses a technique for preventing a film formation failure of an organic EL element in a contact hole. In Patent Document 1, an insulating body is embedded in an electrode hole above a pixel electrode, a protective section is formed, and then a film made of an organic EL material is formed so that a film formation failure of the organic EL material in the electrode hole can be prevented. Thus, occurrence of electric current concentration caused by short-circuiting of an upper electrode and a lower electrode of the organic EL element can be prevented, and thus light emission failure of the organic EL layer can be prevented.

PRIOR ART DOCUMENT

Patent Document

[Patent Document 1]
Japanese Unexamined Patent Application, First Publication No. 2014-103117

SUMMARY OF THE INVENTION

Problem to be Solved by the Invention

However, since a lower electrode of an organic EL element is not formed in an electrode hole in Patent Document 1, a portion above a contact hole top of the organic EL element does not emit light. In the case of such a configuration, since a non-light emitting region due to the contact hole occupies a wide region of a pixel area, it is difficult to realize high-definition of a display panel.

An aspect of the present invention was made in view of the above-described problem in the related, and an objective of the present invention is to provide an organic electroluminescence device capable of causing an organic EL element above a contact hole top to emit light.

Means for Solving the Problems

An organic electroluminescence device according to one aspect of the present invention includes: a substrate; a thin film transistor provided above the substrate; a flattening layer provided above the thin film transistor and including a contact hole which is open on a side opposite to the substrate; a reflecting layer provided along at least a surface of the contact hole; a light-transmitting filling layer configured to fill an inside of the contact hole with the reflecting layer therebetween; and an organic EL element formed above the flattening layer and a contact hole top.

In the organic electroluminescence device according to one aspect of the present invention, a configuration may be that a cross-sectional shape of the contact hole cut at any plane which is perpendicular to an upper surface of the substrate is a circular arc shape.

In the organic electroluminescence device according to one aspect of the present invention, a configuration may be that a lower surface of the organic EL element at a position of the contact hole is located below a surface of the reflecting layer located in a portion other than the contact hole which is opposite to the substrate.

In the organic electroluminescence device according to one aspect of the present invention, a configuration may be that a cross section of the reflecting layer in the contact hole is a rotationally symmetric parabola centered on a central axis which passes through a lowest point at a center of the contact hole and is perpendicular to the upper surface of the substrate.

In the organic electroluminescence device according to one aspect of the present invention, a configuration may be that a cross-sectional shape of the reflecting layer in the contact hole is a parabolic shape in which a focal point of the parabola is located inside a light emitting layer.

In the organic electroluminescence device according to one aspect of the present invention, a configuration may be that the organic EL element includes: a first electrode provided at at least an upper layer side of the filling layer and having optical transparency; an organic layer provided on an upper layer side of the first electrode and including at least a light emitting layer; and a second electrode provided on an upper layer side of the organic layer and having optical transparency and light reflectivity.

In the organic electroluminescence device according to one aspect of the present invention, a configuration may be that one pixel is configured by arranging a plurality of sub-pixels including the organic EL element provided above the contact hole top.

Effect of the Invention

According to an aspect of the present invention, an objective of the present invention is to provide an organic electroluminescence device capable of causing an organic EL element above a contact hole top to emit light.

EMBODIMENTS FOR CARRYING OUT THE INVENTION

Embodiments of the present invention will be described below.

Note that, in the following drawings, in order to allow constituent elements to be seen easily, dimensions of the constituent elements are illustrated with different sizes in accordance with the constituent elements in some cases.

[First Embodiment]

A first embodiment of the present invention will be described below.

An organic electroluminescence (EL) device according to the first embodiment is an example of a top emission type organic EL device configured to adopt a microcavity structure.

Figure 1:
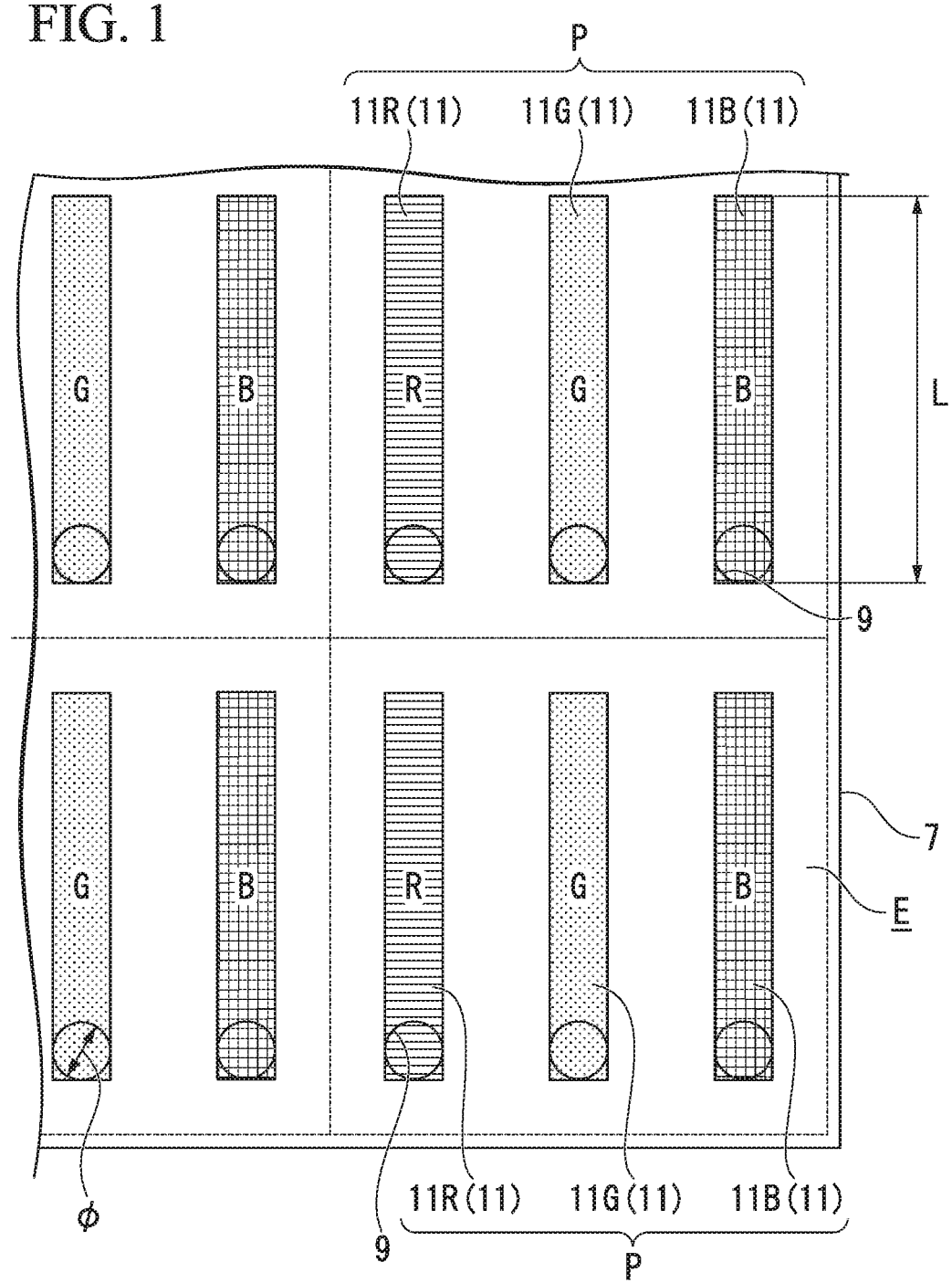
FIG. 1 is a plan view of an organic electroluminescence (EL) device according to a first embodiment.

FIG. 1 is a plan view of the organic EL device according to the first embodiment.

An organic EL device 1 is a display device including a display region E in which a plurality of pixels P are arranged in a matrix form. Each pixel P is constituted of three RGB sub-pixels 11 which are sequentially disposed in the left to right direction of the display region E. The red sub-pixel 11R emits red light, the green sub-pixel 11G emits green light, and the blue sub-pixel 11B emits blue light. In the case of the red sub-pixel 11R, the green sub-pixel 11G, and the blue sub-pixel 11B, only constituent materials of light emitting layers thereof differ and the other constitutions are the same. In the embodiment, the sub-pixels 11R, 11B, and 11G of each color are formed using known different coloring methods. The red sub-pixel 11R, the green sub-pixel 11G, and the blue sub-pixel 11B can be independently supplied with an electric field (driven).

Although not illustrated in FIG. 1, for example, a plurality of data lines and a plurality of scanning lines are alternately provided in a substrate 7, and one of the sub-pixels 11 is provided in a region surrounded by data lines which are adjacent to each other and scanning lines which are adjacent to each other.

As shown in FIG. 1, each of the sub-pixels 11 has a rectangular shape when viewed from a direction normal to an upper surface of the organic EL device 1. Furthermore, a planar shape of one pixel P is a square shape and a length L0 of one side of the square shape is, for example, 90 μm.

In the embodiment, a contact hole 9, a planar shape of which is a circular shape, is provided for each sub-pixel 11. A diameter Φ of the contact hole 9 is, for example, 5 to 7 μm. Note that the planar shape of the contact hole 9 is not limited to a circular shape and may be other shapes.

Figure 2:
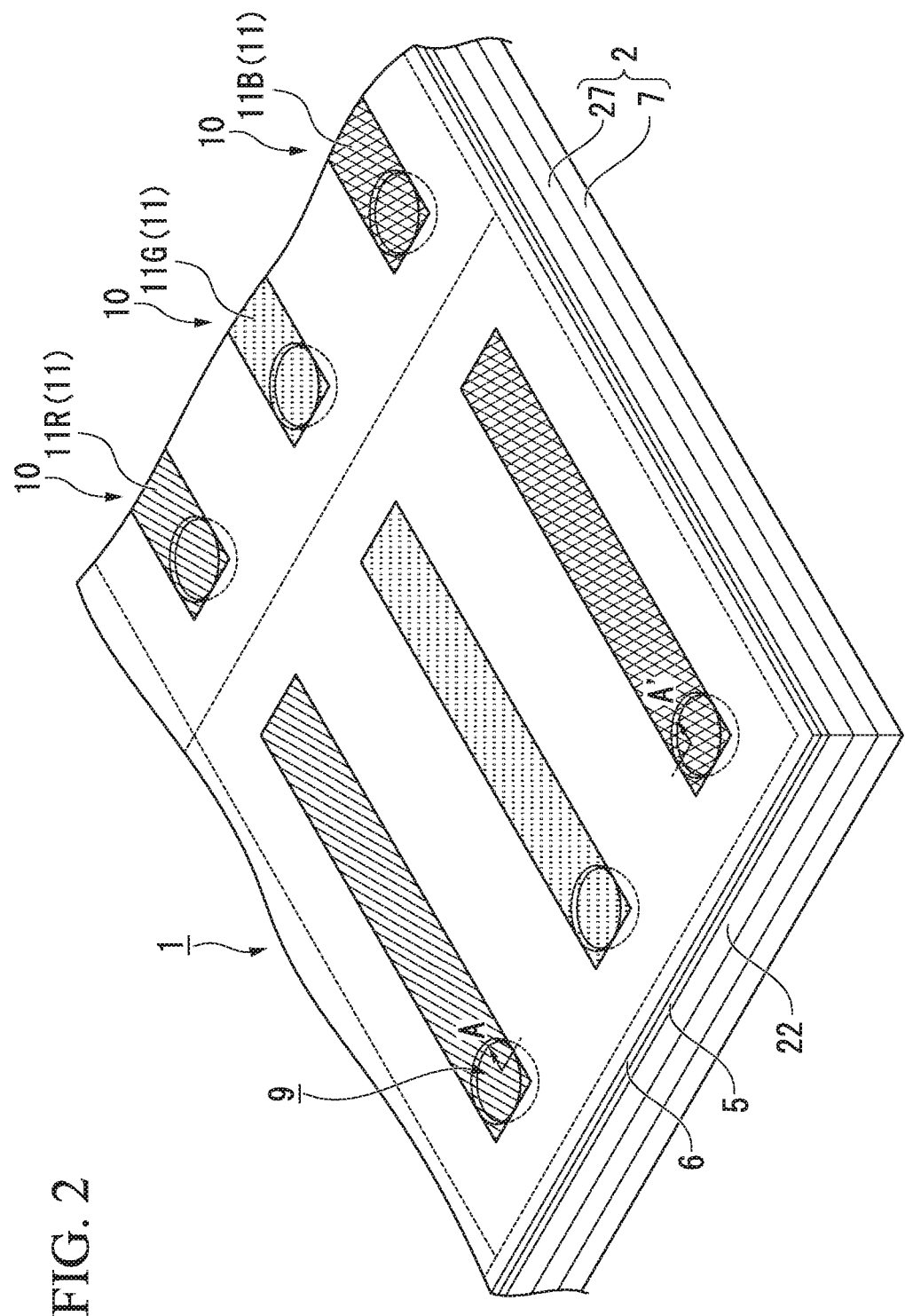
FIG. 2 is a perspective view of the organic EL device according to the first embodiment.
Figure 3:
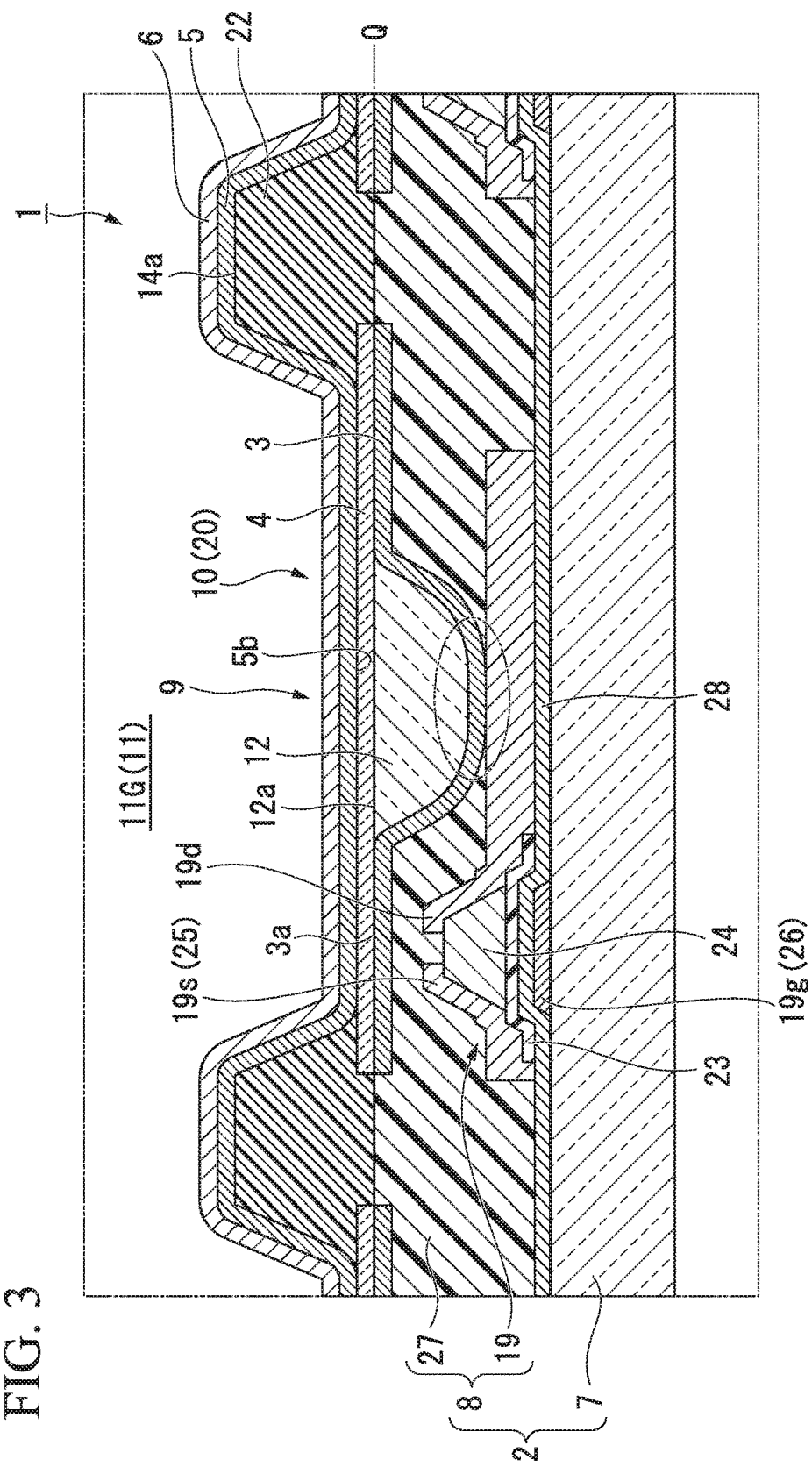
FIG. 3 is a cross-sectional view of the organic EL device cut along any plane which is perpendicular to an upper surface of a substrate thereof.

FIG. 2 is a perspective view of the organic EL device according to the first embodiment. FIG. 3 is a cross-sectional view of the organic EL device cut along any plane which is perpendicular to an upper surface of a substrate thereof, and is the cross-sectional view taken along line A-A' of FIG. 1. FIG. 3 illustrates a structure of a connection portion between a thin film-transistor (TFT) element and a pixel electrode.

In the case of the organic EL device 1 according to the embodiment, as shown in FIG. 2, the organic EL device 1 includes a TFT array substrate 2 and a plurality of organic EL elements 10 and a part of each organic EL element 10 provided for each sub-pixel 11 is formed above each contact hole 9. In the related art, organic EL elements 10 are formed except in regions above contact holes 9 of TFTs 19, but in the embodiment, each of the organic EL elements 10 is configured to be formed in a region including one of the contact holes 9. For this reason, a light emitting region is enlarged compared to the related art.

As shown in FIG. 3, the organic EL element 10 includes a first electrode 4, an organic layer 5 including a light emitting layer, and a second electrode 6. The organic EL device 1 is a top emission type organic EL device and sends out light emitted from the light emitting layer from the second electrode 6 side.

The organic EL element 10 according to the embodiment is connected to a data line and a scanning line via a switching element such as a thin film transistor (hereinafter abbreviated to a "TFT 19"). In other words, the organic EL device 1 according to the embodiment is an active matrix type organic EL device. Here, as a constitution in which the sub-pixels 11 are independently supplied with an electric field, an active matrix type in which the TFT 19 illustrated in FIG. 3 is used is adopted. However, the present invention is not limited to such a type, and types such as, for example, a simple matrix type and a segment driving type may be adopted.

The TFT array substrate 2 is configured to include the substrate 7 and a TFT element layer 8. The TFT element layer 8 includes a plurality of TFTs 19 formed above the substrate 7 for each sub-pixel 11 and a flattening layer 27 configured to flatten the plurality of TFTs 19.

The contact hole 9 configured to connect the organic EL element 10, and the data line and the scanning line is formed in the flattening layer 27. To be specific, a part of the organic EL element 10 is formed in the contact hole 9, and a reflecting layer 3, a filling layer 13, the first electrode 4, the organic layer 5, and the second electrode 6 are stacked in this order from the TFT array substrate 2 side.

The reflecting layer 3, the first electrode 4, and the organic layer 5 including the light emitting layer of the embodiment are separate for each sub-pixel 11. The first electrode 4 of each of the organic EL elements 10 is connected to the TFT 19 via the reflecting layer 3 in the contact hole 9.

Examples of a material of the substrate 7 include a glass substrate and a flexible substrate made of a polyimide or the like. Note that, since the organic EL device 1 is a top emission type organic EL device, the substrate 7 need not necessarily have optical transparency, and for example, a semiconductor substrate such as a silicon substrate may be used.

The TFT element layer 8 includes the TFT 19 and the flattening layer 27 formed above the TFT 19 which are formed in the sub-pixel 11.

The TFT 19 of the embodiment functions as a switching element provided in the sub-pixel 11. The TFT 19 is formed using a well-known method and includes a gate electrode 19g, a gate insulating film 28, a source electrode 19s, and a drain electrode 19d.

To be specific, the gate electrode 19g and a source wiring 26 are formed above the substrate 7, and the gate insulating film 28 is formed such that the gate insulating film 28 covers the gate electrode 19g and the source wiring 26. An active layer 23 is formed above the gate insulating film 28 and the source electrode 19s, the drain electrode 19d, and a data wiring 25 are formed above the active layer 23. The drain electrode 19d and the data wiring 25 are formed above an etching stopper 24 above the active layer 23 to cross end portions of the etching stopper 24.

The flattening layer 27 is formed to cover the source electrode 19s, the drain electrode 19d, and the data wiring 25. The flattening layer 27 is constituted of a photosensitive resin such as, for example, an acrylic resin, an epoxy resin, and a polyimide resin. The contact hole 9 can be formed through well-known half exposure using a photomask. Here, when the contact hole 9 is formed using other formation methods, a constituent material of the flattening layer 27 may not necessarily have photosensitivity. Furthermore, the constituent material of the flattening layer 27 may not be a resin and may be an inorganic material.

In the embodiment, a thickness of the flattening layer 27 is set to 2 µm.

The flattening layer 27 may not have a single layer structure and may have a multilayer structure in combination with another interlayer insulating film. The contact hole 9 passing through the flattening layer 27 in a film thickness direction and reaching the drain electrode 19d is formed in the flattening layer 27. The drain electrode 19d of the TFT 19 is electrically connected to the reflecting layer 3 formed above the TFT element layer 8 via the contact hole 9.

The reflecting layer 3 is formed to cover the drain electrode 19d exposed in the contact hole 9 and an inner surface of the contact hole 9 and cover a part of an upper surface of the flattening layer 27 in the sub-pixel region. A cross-sectional shape of the reflecting layer 3 is a circular arc shape. In other words, an inner surface of the reflecting layer 3 forms a part of a spherical surface in three dimensions.

As a constituent material of the reflecting layer 3, for example, a highly reflective metal such as aluminum and silver is preferably used. In the case of the embodiment, the reflecting layer 3 is constituted of, for example, an aluminum film with a film thickness of 100 nm.

A portion of the reflecting layer 3 which is located above the flattening layer 27 is electrically connected to the first electrode 4 of the organic EL element 10. In other words, the drain electrode 19d of the TFT 19 is configured to be electrically connected to an anode of the organic EL element 10 via the contact hole 9 and the reflecting layer 3.

An inside of the contact hole 9 is filled with a filling layer 12 with the reflecting layer 3 therebetween. An upper portion of the contact hole 9 is flattened by the filling layer 12. An upper surface 12a of the filling layer 12 is at the same height as a plane including an outmost surface of the substrate 7, specifically, a plane Q including a flat surface 3a of the reflecting layer 3. Note that the filling layer 12 is not formed to rise above the plane Q.

The filling layer 12 is constituted of a light transmissive resin. To be specific, examples of a material of the filling layer 12 include an acrylic resin, an epoxy resin, a polyimide resin, and the like. A refractive index of the filling layer 12 of the embodiment is, for example, 1.5.

In the embodiment, when the filling layer 12 is formed, first, an upper surface side of the substrate 7 is coated with a positive type photosensitive acrylic resin using a spin coating method so that a resin film with a film thickness of 3 µm is formed. Subsequently, a contact hole pattern is formed, and then the resin film which has been previously formed is exposed and developed using a photomask with inverted negative and positive patterns. Subsequently, the resin film is thinned to an extent that the resin film becomes flush with an upper surface of the reflecting layer 3 using an ashing process. Note that, at this time, a photomask is set to have a pattern which is 1 to 2 µm (+2 to 4 µm in a diameter) larger than that of the actual contact hole 9 over the entire circumference of the contact hole pattern.

The first electrode 4 is formed over the upper surface 12a of the filling layer 12 and the flat surface 3a of the reflecting layer 3. In the embodiment, the upper surface 12a of the filling layer 12 is substantially flush with the flat surface 3a of the reflecting layer 3. The first electrode 4 is a transparent electrode constituted of, for example, a transparent conductive film such as indium tin oxide (ITO) and indium zinc oxide (IZO) and has optical transparency. In the case of the embodiment, for example, a transparent conductive film made of indium zinc oxide (IZO) with a film thickness of 120 nm is used for the first electrode 4. The first electrode 4 is formed using a well-known method. The first electrode 4 functions as an anode configured to inject holes into the organic layer 5.

Edge covers 22 configured to separate the sub-pixels 11 are formed above the TFT array substrate 2. Each of the edge covers 22 is formed between the sub-pixels 11 and electrically separates reflecting layers 3 and first electrodes 4 of neighboring sub-pixels 11. The edge covers 22 are formed using a resin material by a well-known method. The same photosensitive acrylic resin as a resin material of the flattening layer 27 may be used for the edge cover 22. In the embodiment, the same material as the flattening layer 27 is used as a material of the edge cover 22 but the material thereof may be different.

The organic layer 5 is stacked above the first electrode 4 and the edge cover 22. The organic layer 5 is formed to cover a part of an upper surface 14a of the edge cover 22 and is separated from an organic layer 5 of a neighboring sub-pixel 11 formed in the upper surface 14a of the same edge cover 22. The organic layer 5 is formed to reflect a shape of the edge cover 22 and has a step on an outer circumference of the contact hole 9. The organic layer 5 is a stacked body made of an organic material and including a hole injection layer, a hole transport layer, a light emitting layer, an electron transport layer, and an electron injection layer.

The second electrode 6 is stacked along an upper surface of the organic layer 5. The second electrode 6 reflects a shape of the organic layer 5 and has a step in the outer circumference of the contact hole 9. The second electrode 6 is, for example, a translucent electrode constituted of a metal thin film of silver, a magnesium silver alloy, or the like. In other words, the second electrode 6 has both optical transparency and light reflectivity, transmits a part of incident light, and reflects the rest. A metal with a small work function is preferably used for the second electrode 6, and for example, Ag, Al, a magnesium alloy (MgAg and the like), an aluminum alloy (AlLi, AlCa, AlMg, and the like), or the like is used for the second electrode 6. In the case of the embodiment, the second electrode 6 is constituted of, for example, a stacked film of a MgAg alloy with a film thickness of 1 nm and Ag with a film thickness of 19 nm. The second electrode 6 functions as a cathode configured to inject electrons into the organic layer 5.

In the embodiment, a region sandwiched by the first electrode 4 and the second electrode 6 forms a microcavity structure. Light emitted from the light emitting layer is subject to multiple reflections between the first electrode 4 and the second electrode 6. At this time, a specific wavelength component of the light emitted from the light emitting layer is strengthened. Furthermore, although not illustrated in FIG. 3, an optical adjustment layer referred to as a cap layer is stacked above an upper surface of the second electrode 6.

Figure 4:
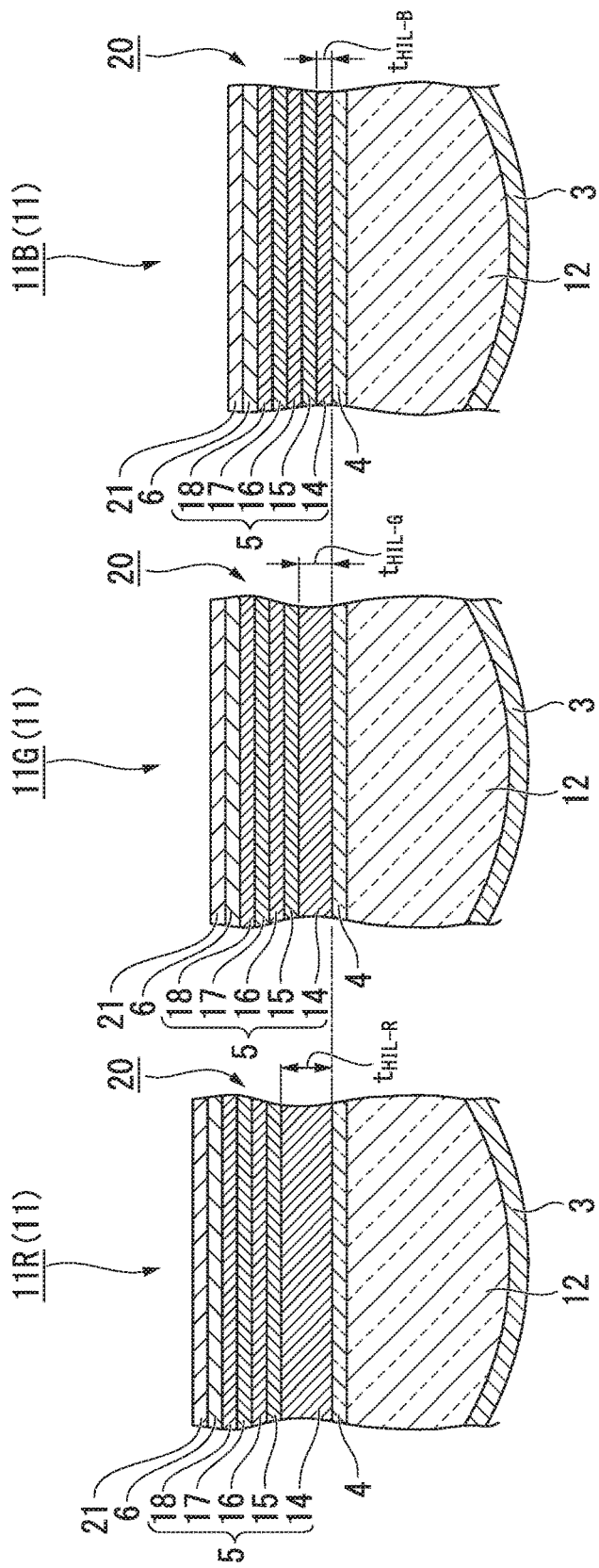
FIG. 4 is a cross-sectional view showing a detailed constitution for each sub-pixel of each color.

FIG. 4 is a cross-sectional view showing a detailed constitution for each sub-pixel 11 of each color.

In the case of three sub-pixels 11R, 11G, and 11B shown in FIG. 4, only film thicknesses of hole injection layers differ and basic structures thereof are the same.

As shown in FIG. 4, the organic layer 5 is provided as a layer above the first electrode 4. The organic layer 5 is constituted of a stacked film obtained by stacking a hole injection layer 14, a hole transport layer 15, a light emitting layer 16, an electron transport layer 17, and an electron injection layer 18 from the first electrode 4 side. Here, other layers other than the light emitting layer 16 may be appropriately added as necessary. Furthermore, both a transport layer and an injection layer may be used for one layer. In the embodiment, as described above, an organic layer with a five-layer structure of the hole injection layer 14, the hole transport layer 15, the light emitting layer 16, the electron transport layer 17, and the electron injection layer 18 is exemplified. In addition, if necessary, a layer for blocking movement of electric charges to an opposite electrode such as a hole blocking layer and an electron blocking layer may be appropriately added.

The hole injection layer 14 is a layer having a function of improving hole injection efficiency from the first electrode 4 to the light emitting layer 16. Examples of a material of the hole injection layer 14 include benzine, styrylamine, triphenylamine, porphyrins, triazole, imidazole, oxadiazole, polyarylalkanes, phenylenediamine, arylamines, oxazole, anthracene, fluorenone, hydrazone, stilbene, triphenylene, azatriphenylene, or derivatives thereof, or heterocyclic conjugated monomers, oligomers, polymers, or the like, such as a polysilane-based compound, a vinylcarbazole-based compound, a thiophene-based compound, or an aniline-based compound. In addition, such an organic material is mixed with molybdenum oxide. A mixing ratio of such an organic material and molybdenum oxide is, for example, about 80% for the organic material and about 20% for the molybdenum oxide.

The hole transport layer 15 is a layer having a function of improving hole transport efficiency from the first electrode 4 to the light emitting layer 16. The same organic materials as for the hole injection layer 14 may be used for the hole transport layer 15. Note that the hole injection layer 14 and the hole transport layer 15 may be integrated or may be formed as independent layers.

The light emitting layer 16 has a function of recombining holes injected from the first electrode 4 side and electrons injected from the second electrode 6 side and emitting light from deactivation energy. Examples of a material of the light emitting layer 16 include, for example, a material constituted of a host material and a dopant material. In addition, the light emitting layer 16 may include an assist material. The host material is contained at the highest proportion among constituent materials in the light emitting layer 16. For example, a mixing ratio of the host material and the dopant material is about 90% for the host material and about 10% for the dopant material. The host material has a function of facilitating film formation of the light emitting layer 16 and maintaining the light emitting layer 16 in a film state. Therefore, it is required that the host material is a stable compound which is less prone to crystallize after the film formation and is less prone to chemical change. Furthermore, the host material has a function of recombining carriers in host molecules and transferring excitation energy to the dopant material to cause the dopant material to emit light when an electric field is applied between the first electrode 4 and the second electrode 6. A thickness of the light emitting layer 16 is, for example, about 60 nm.

Examples of a specific material of the light emitting layer 16 include materials including substances with high luminescence efficiency such as low-molecular-weight fluorescent dyes, fluorescent polymers, and metal complexes. Examples of the material of the light emitting layer 16 include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or derivatives thereof, and tris(8-quinolinolato)aluminum complexes, bis(benzoquinolinolato)beryllium complexes, tri(dibenzoylmethyl)phenanthroline europium complexes, ditolylvinylbiphenyl, and the like.

The electron transport layer 17 has a function of improving electron transport efficiency from the second electrode 6 to the light emitting layer 16. Examples of a material of the electron transport layer 17 include quinoline, perylene, phenanthroline, bisstyryl, pyrazine, triazole, oxazole, oxadiazole, fluorenone, or derivatives thereof, and metal complexes. To be specific, examples of the material of the electron transport layer 17 include tris(8-hydroxyquinoline)aluminum, anthracene, naphthalene, phenanthrene, pyrene, anthracene, perylene, butadiene, coumarin, acridine, stilbene, 1,10-phenanthroline, or derivatives thereof, metal complexes, and the like. A thickness of the electron transport layer 17 is, for example, about 15 nm.

The electron injection layer 18 has a function of improving electron injection efficiency from the second electrode 6 to the light emitting layer 16. Examples of a material of the electron injection layer 18 include metallic calcium (Ca) and a compound such as lithium fluoride (LiF). Note that the electron transport layer 17 and the electron injection layer 18 may be integrated and may be formed as independent layers. A thickness of the electron injection layer 18 is, for example, about 0.5 nm.

A microcavity structure 20 has an effect of utilizing a resonance of light generated between the first electrode 4 and the second electrode 6 to enhance light with a specific wavelength. In the case of the embodiment, wavelengths of light emitted from red, green, and blue sub-pixels 11R, 11G, and 11B differ. For this reason, an optical path length between the first electrode 4 and the second electrode 6 corresponds to an emission spectrum peak wavelength of each color.

There are various methods of differentiating optical path lengths of microcavity structures 20 of the sub-pixels 11R, 11G, and 11B. However, here, from the viewpoint of minimizing an influence on a resistance value as much as possible, a method of differentiating thicknesses of hole injection layers 14 is adopted. When a thickness of a hole injection layer 14 of the red sub-pixel 11R is set to tHIL-R, a layer thickness of a hole injection layer 14 of the green sub-pixel 11G is set to tHIL-G, and a layer thickness of a hole injection layer 14 of the blue sub-pixel 11B is set to tHIL-B, tHIL-R>tHIL-G>tHIL-B is set.

With the microcavity structure 20, light emitted from the organic layer 5 is repeatedly reflected within a predetermined optical length range between the first electrode 4 and the second electrode 6, and light with a predetermined wavelength corresponding to the optical path length resonates and thus is enhanced. On the other hand, light with a wavelength which does not correspond to the optical path length is weakened. As a result, a spectrum of light extracted to the outside has sharpness and has a high intensity, and thus luminance and color purity are improved.

With regard to constituent materials of the light emitting layer 16, a light emitting material configured to emit red light may be used for the red sub-pixel 11R, a light emitting material configured to emit green light may be used for the green sub-pixel 11G, and a light emitting material configured to emit blue light may be used for the blue sub-pixel 11B. In the case of the embodiment, in any sub-pixel region, a bipolar material can be used for the host material.

In the dopant material, phosphorescent materials are used for the red sub-pixel 11R and the green sub-pixel 11G and a fluorescent material is used for the blue sub-pixel 11B. In the thicknesses of the light emitting layer 16, thicknesses of the red sub-pixel 11R and the green sub-pixel 11G are, for example, about 60 nm, and a thickness of the blue sub-pixel 11B is, for example, about 35 nm.

Alternatively, the same light emitting material configured to emit white light may be used for all of the red sub-pixel 11R, the green sub-pixel 11G, and the blue sub-pixel 11B. Also in this case, light with different wavelengths resonates and is amplified by the sub-pixels 11R, 11G, and 11B, and thus red light is emitted from the red sub-pixel 11R, green light is emitted from the green sub-pixel 11G, and blue light is emitted from the blue sub-pixel 11B.

A cap layer 21 is stacked above the upper surface of the second electrode 6. The cap layer 21 functions as a protective layer used to protect the second electrode 6 and functions as an optical adjustment layer. Note that a color filter may be added to an upper layer side of the second electrode 6. Light emitted from the organic layer 5 passes through the color filter, thereby increasing color purity.

An example of a specific constitution of the organic EL device 1 is, for example, as illustrated in [Table 1].

TABLE 1

| | Green |
|---|---|
| ITO: 120 nm | ITO: 120 nm |
| HIL organic HTL material (80%):MoOx (20%) | 70 nm |
| HTL organic HTL material | 10 nm |
| EML | H (90%):(10%) |

TABLE 1-continued

| | Green |
|---|---|
| | 60 nm |
| | H: Bipolar material |
| | d: Phosphorescent material |
| ETL organic ETL material | 15 nm |
| EIL LiF | 0.5 nm |
| Cathode (Translucent electrode) | MgAg 1 nm/Ag 19 nm |
| Cap layer | 78 nm |

As described above, in the organic EL device according to the embodiment, the organic layer 5 is differently colored for each sub-pixel 11 of each color so that the organic EL element is formed. Hereinafter, such a constitution will be referred to as a different coloring type.

As a modified example of the organic EL device, a color filter corresponding to each sub-pixel of each other may be configured to be provided in a white light-emitting organic EL element. Hereinafter, such a constitution is referred to as a color filter type.

Next, the inventors of the present invention prepared an organic EL device according to the embodiment and organic EL devices in the related art to verify effects of the organic EL device of one aspect of the present invention and compared luminances of pixels thereof. Combinations of light emitting regions (of a different coloring type and a color filter type) and light emitting regions (which include or do not include contact hole formation regions) are adopted as evaluation items, and differences of numerical apertures due to combinations thereof will be described.

FIGS. 5A to 5D illustrate plane constitutions of the sub-pixels 11 in the organic EL device according to the embodiment (Example 1) and sub-pixels 11 of the modified example and the organic EL devices in the related art (Comparative Example 1 and Comparative Example 2), respectively.

Note that, in all cases, a size of one pixel is set to 90 μm. Furthermore, in FIGS. 5A to 5D, light emitting regions of R, G, and B sub-pixels 11R, 11G, and 11B are indicated by different hatching.

Figure 5A:
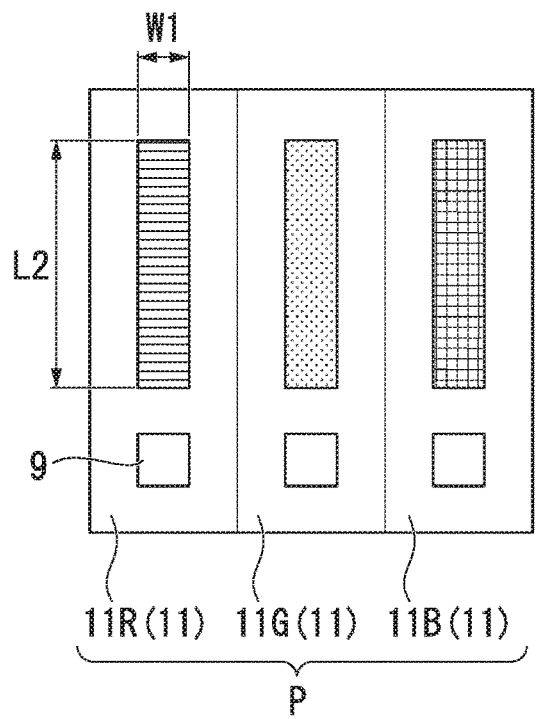
FIG. 5A is a diagram showing a sub-pixel structure (a different coloring type; a structure in which no contact hole tops are included) of an organic EL device of Comparative Example 1.

FIG. 5A is a diagram showing a sub-pixel structure (a different coloring type; a structure in which contact hole tops are not included) of the organic EL device of Comparative Example 1. A horizontal width W1 of one sub-pixel is 10 μm and a vertical width Z2 thereof is 50 μm.

Figure 5B:
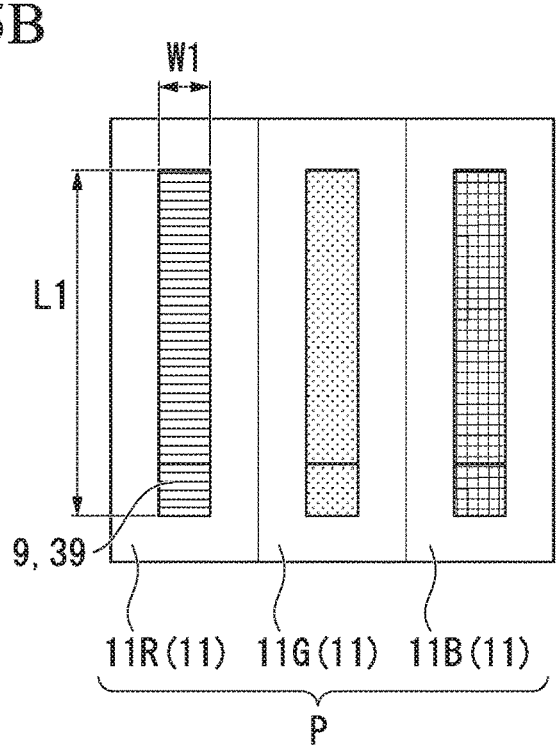
FIG. 5B is a diagram showing a sub-pixel structure (a different coloring type; a structure in which contact hole tops are included) of an organic EL element of Example 1.

FIG. 5B is a diagram showing a sub-pixel structure (a different coloring type; a structure in which contact hole tops are included) of the organic EL element of Example 1. A horizontal width W1 of one sub-pixel is 10 μm and a vertical width Z1 thereof is 70 μm.

Figure 5C:
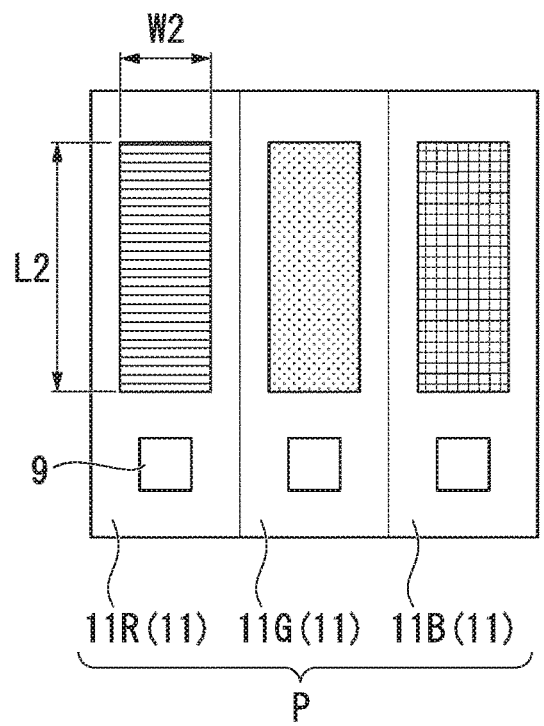
FIG. 5C is a diagram showing a sub-pixel structure (a color filter type; a structure in which no contact hole tops are included) of an organic EL element of Comparative Example 2.

FIG. 5C is a diagram showing a sub-pixel structure (a color filter type; a structure in which contact hole tops are not included) of the organic EL element of Comparative Example 2. A horizontal width W2 of one sub-pixel is 20 μm and a vertical width Z2 thereof is 50 μm.

Figure 5D:
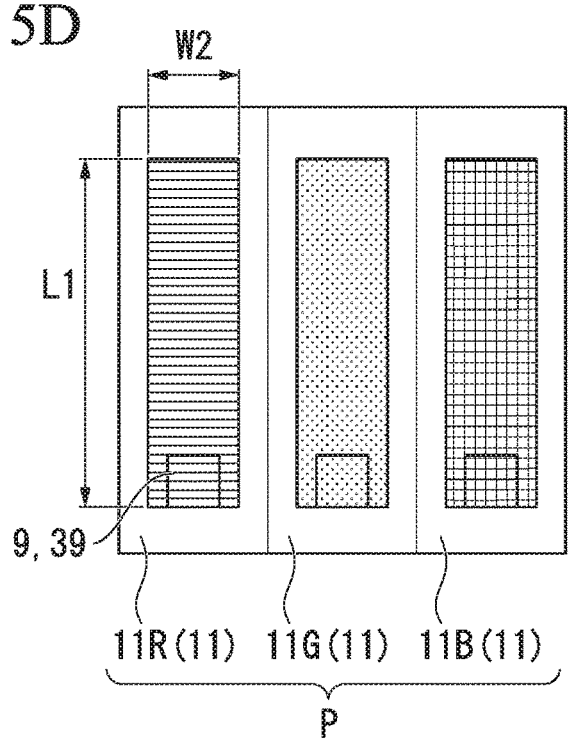
FIG. 5D is a diagram showing a sub-pixel structure (a color filter type; a structure in which contact hole tops are included) of an organic EL element of a modified example.

FIG. 5D is a diagram showing a sub-pixel structure (a color filter type; a structure in which contact hole tops are included) of the organic EL element of the modified example. A horizontal width W2 of one sub-pixel is 20 μm and a vertical width Z2 thereof is 70 μm.

Comparing constitutions of the drawings, light emitting regions of the organic EL devices of Example 1 and the modified example are larger by an amount according to the contact hole tops.

Specific numerical apertures (luminance ratios) of the constitutions are, for example, as illustrated in [Table 2]. Comparison is made with sub-pixels with the same color.

TABLE 2

|  |  | Sub-pixel numerical aperture | One pixel numerical aperture |
|---|---|---|---|
| Different coloring type | FIG. 5A | 18.5% | 6.2% |
|  | FIG. 5B | 25.9% | 8.6% |
| Color filter type | FIG. 5C | 44.4% | 14.8% |
|  | FIG. 5D | 59.3% | 19.8% |

As illustrated in [Table 2], it can be seen that the numerical apertures of the sub-pixels of the constitutions in which contact hole tops are included in the light emitting regions (FIG. 5B: Example 1 and FIG. 5D: the modified example) are higher than the numerical apertures of the sub-pixels of the constitutions in the related art in which contact hole tops are not included in the light emitting regions (FIG. 5A: Comparative Example 1 and FIG. 5C: Comparative Example 2). Numerical apertures of one pixel of the constitutions in which the light emitting regions include contact hole tops are higher than those of the constitutions in which the light emitting regions do not include contact hole tops.

To be specific, the numerical aperture of Example 1 illustrated in FIG. 5B was improved by 1.4 times compared to Comparative Example 1 of the different coloring type in which the light emitting region illustrated in FIG. 5A did not include contact hole tops.

Furthermore, the numerical aperture of the organic EL element of the modified example illustrated in FIG. 5D was improved by 1.3 times compared to Comparative Example 2 of the color filter type in which the light emitting region illustrated in FIG. 5C did not include contact hole tops.

It could be seen that, in either the different coloring type or the color filter type, when the light emitting region was configured to include contact hole tops, the luminance thereof could be improved by 1.3 times to 1.4 times and light extraction efficiency increased. Thus, panel lives of display panels with the same light emission luminance can be significantly improved.

Here, since cross-sectional shapes of the contact hole portions have a light extraction improvement structure with a substantially circular arc shape, it was confirmed in actual measurement that luminances are improved by 1.4 to 1.5 times. To be specific, when comparison was made with the same electric current values, the numerical aperture of Example 1 illustrated in FIG. 5B was 1.5 times the numerical aperture of Comparative Example 1 illustrated in FIG. 5A and the numerical aperture of the modified example illustrated in FIG. 5D was 1.4 times the numerical aperture of Comparative Example 2 illustrated in FIG. 5C.

Note that there was no difference between luminances of the R, G, and B sub-pixels 11.

Figure 6A:
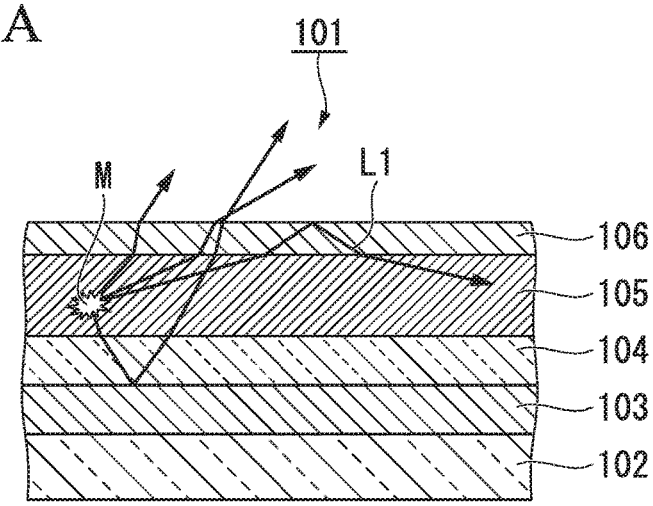
FIG. 6A is a cross-sectional view showing an organic EL device in the related art.
Figure 6B:
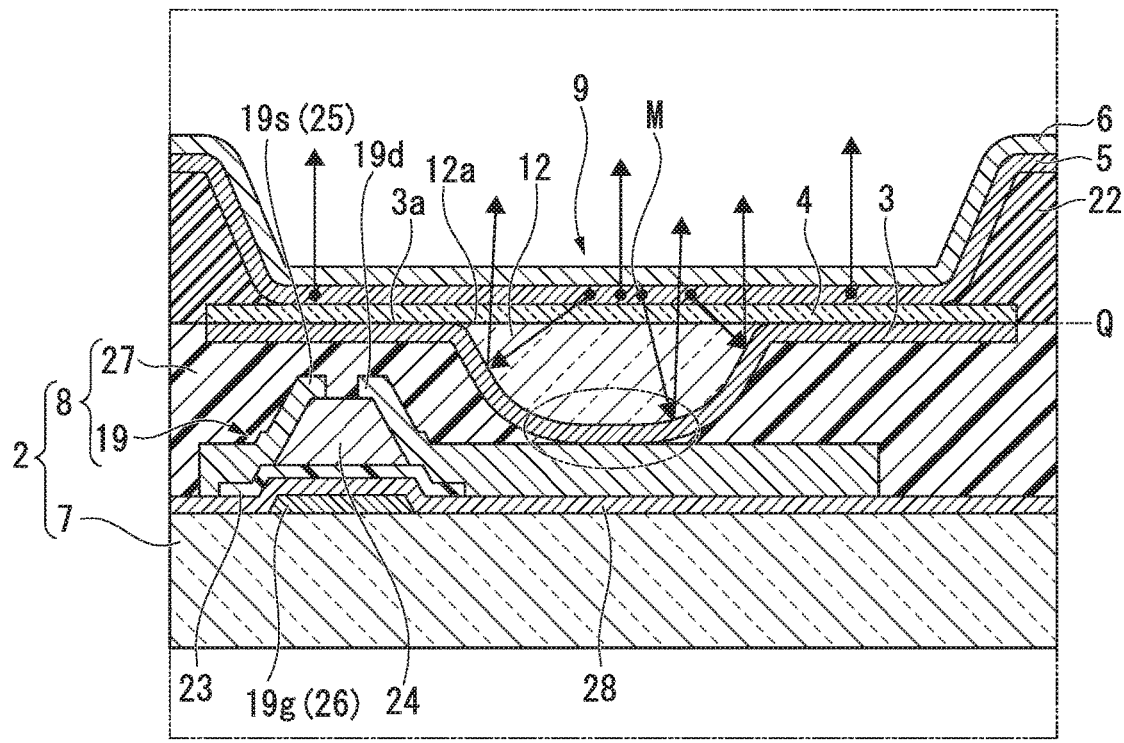
FIG. 6B is a cross-sectional view showing the organic EL device according to the embodiment.

FIG. 6A is a cross-sectional view showing an organic EL device 101 in the related art, and FIG. 6B is a cross-sectional view showing the organic EL device 1 according to the embodiment.

The organic EL device 101 includes a constitution in which a reflecting layer 103, a first electrode 104, an organic layer 105, and a second electrode 106 are sequentially stacked above a substrate 102. In the organic EL device 101, light emitted from a light emitting layer in the organic layer 105 is uniformly sent out in all directions and moves forward inside the organic EL device 101 while being reflected at interfaces of layers with different refractive indexes. The light moving toward the substrate 102 side is reflected by the reflecting layer 103.

Since there is a refractive index difference between the second electrode 106 and an external space (air) at an interface thereof, light which is incident on the interface at a small angle of incidence is emitted to the external space, and light which is incident on the interface at a large angle of incidence is reflected at the interface and moves into the organic EL device 101 again. For example, light L1 emitted in a direction which is close to a true lateral direction from any light emitting point M in the organic layer 105 is reflected at an interface between layers and is less likely to be emitted to the external space even when an angle thereof slightly changes.

Loss due to reflection of the light does not occur at the interface between the second electrode 106 and the external space (air) in a path when the light moves inside the organic EL device 101. On the other hand, since a reflectance of a metal constituting the reflecting layer 103 is generally not 100% at an interface between the first electrode 104 and the reflecting layer 103, loss due to reflection of the light occurs. In addition, a part of the light is absorbed by films while the light moves inside the organic EL device 101. Therefore, the light is attenuated while moving inside the organic EL device 101. Generally, a refractive index of the organic layer 105 is about 1.8. In this case, a proportion of light extracted to the external space from light emitted from the light emitting layer is approximately 20%. As described above, the organic EL device 101 in the related art has a problem of low light utilization efficiency.

In the organic EL device 1 according to the embodiment, since the reflecting layer 3 is curved along the contact hole 9 as shown in FIG. 6B, a moving direction of the light reflected by the reflecting layer 3 changes, and thus the light moves inside the organic EL device 1. At this time, even when a large angle of incidence has originally been provided with respect to the interface between the second electrode 6 and an external space (air), light converted to have a smaller angle of incidence than a critical angle at the interface between the second electrode 6 and the external space when reflected by the reflecting layer 3 is extracted to the external space.

As a result, unlike the organic EL device 101 in the related art illustrated in FIG. 6A, the light L1 emitted from the light emitting point M can be extracted to the external space when the light is reflected by the reflecting layer 3 with a circular arc shape when viewed in a cross-section and then is incident on the interface between the second electrode 6 and the external space at a smaller angle of incidence than the critical angle. Thus, the organic EL device 1 with excellent light utilization efficiency can be provided.

In the embodiment, the upper surface 12a of the filling layer 12 is located on the same plane as the plane Q, and a lower surface 5b of the organic layer 5 is located higher than the plane Q. In this case, since a reflecting layer 3 is not present on a side of the organic layer 5 located inside the contact hole 9, light emitted in a substantially true lateral direction from the light emitting point M in the organic layer 5 is not incident on the reflecting layer 3. However, even in this case, a proportion of light which is incident on the reflecting layer 3, from the light emitted within a predetermined angle range close to the true lateral direction from the light emitting point M in the organic layer 5 is sufficiently higher as compared to in the organic EL device 101 in the related art. Therefore, even in the case of the constitution of this embodiment, the organic EL device with excellent light utilization efficiency can be provided.

[Second Embodiment]

Next, a constitution of an organic EL device according to a second embodiment will be described.

Although a basic constitution of the second embodiment is substantially the same as that of the above-described embodiment, the second embodiment and the above-described embodiment differ in that a lower surface of a first electrode at a position of a contact hole is located below a plane including an upper surface of a TFT array substrate. Thus, in the following description, differences from the above-described embodiment will be described in detail, and a description of other common constitutions will be omitted.

Figure 7:
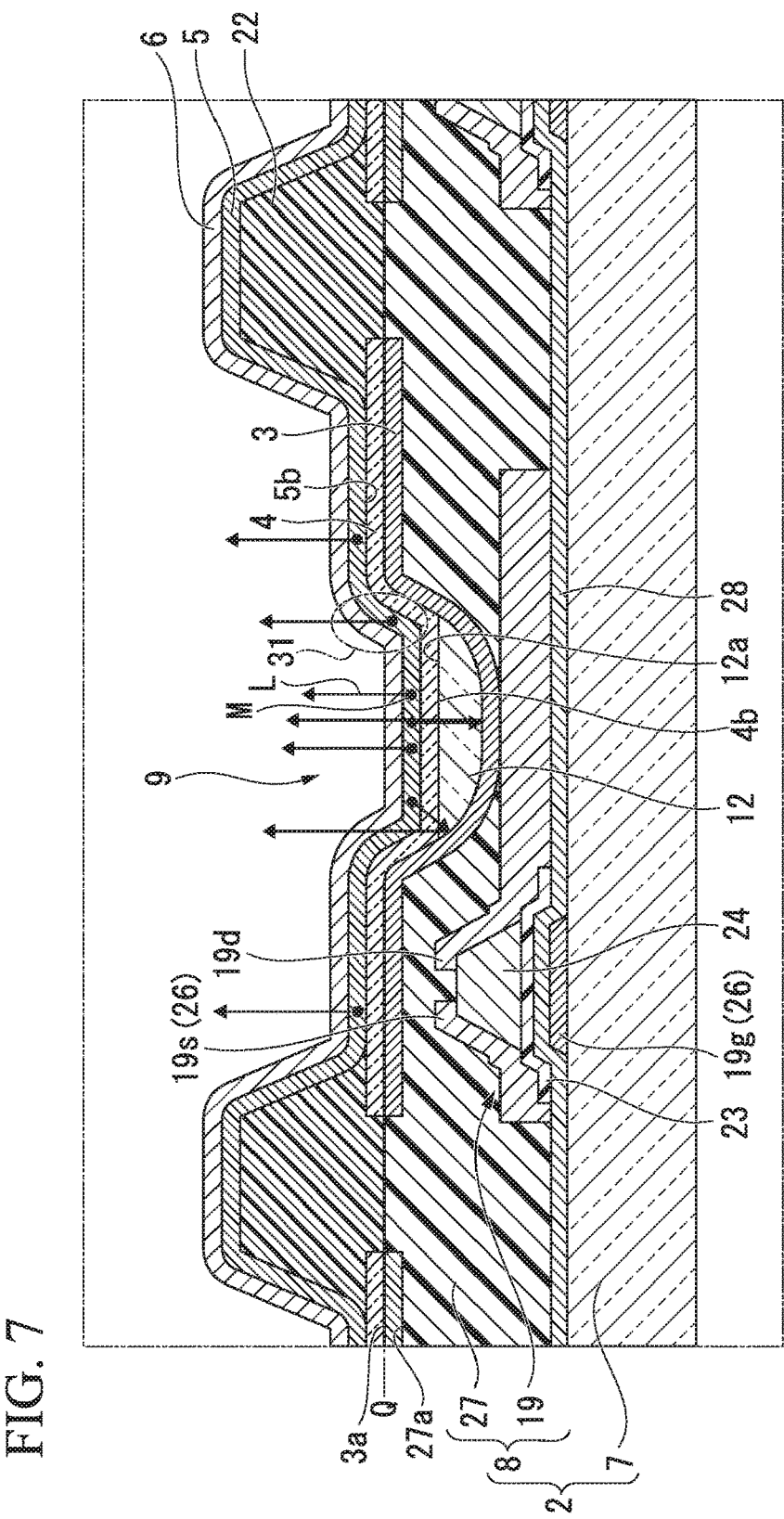
FIG. 7 is a cross-sectional view showing a constitution of a main part of an organic EL device according to a second embodiment.

FIG. 7 is a cross-sectional view showing a constitution of a main part of an organic EL device according to the second embodiment.

Figure 8:
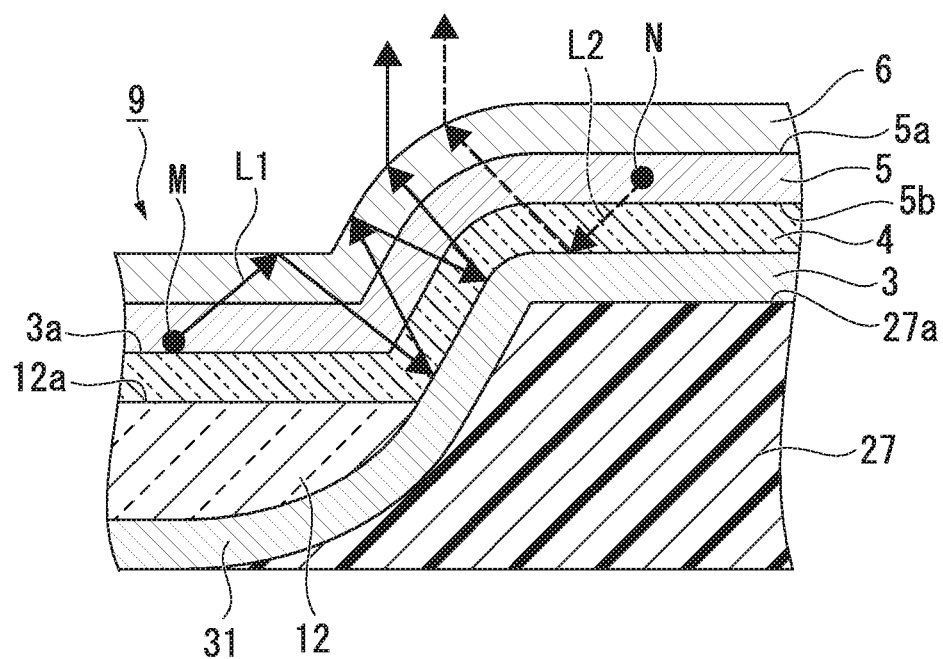
FIG. 8 is an enlarged optical path diagram of a region surrounded by an alternating single dot-dash line of FIG. 7.

FIG. 8 is an enlarged optical path diagram of a region surrounded by a one-dot chain line of FIG. 7.

In the organic EL device according to the embodiment, as shown in FIG. 7, an upper surface 12a of a filling layer 12 which fills a contact hole 9 with a reflecting layer 3 therebetween is located below an upper surface 27a of a flattening layer 27. Such a constitution can be realized by making an ashing process time at a time of forming the filling layer 12 longer than that in the above-described embodiment.

Here, when an ashing process time is long and an amount of engraving is increased, an inclined section 31 of the reflecting layer 3 located on an edge section of the contact hole 9 is steep, and thus a film formation failure may occur in a first electrode 4, an organic layer 5, or the like which will be formed later. When the inclined section 31 of the reflecting layer 3 is steep, each film thickness of the organic layer 5 is thin and a line of the first electrode 4 may be disconnected, which results in short-circuiting and pixel defects. In order not to cause such a problem, the reflecting layer 3 is formed such that a cross-sectional shape thereof is gentle.

The first electrode 4 is stacked above the reflecting layer 3 and the filling layer 12 along shapes of the reflecting layer 3 and the filling layer 12 and covers a part of a surface of the reflecting layer 3 including the inclined section 31 and the entire upper surface 12a of the filling layer 12. A portion of the first electrode 4 which is located above the upper surface 27a of the flattening layer 27 is in contact with a part of the reflecting layer 3. In a position inside the contact hole 9, a lower surface 4b of the first electrode 4 is in contact with the upper surface 12a of the filling layer 12. Therefore, the lower surface 4b of the first electrode 4 is located below a plane Q including a flat surface 3a of the reflecting layer 3.

The organic layer 5 is stacked above the first electrode 4 to reflect a shape of the first electrode 4 and has a step in a circumferential portion of the contact hole 9. A lower surface 5b of the organic layer 5 is located below the plane Q including the flat surface 3a of the reflecting layer 3. Detailed constitutions and functions of layers constituting the organic layer 5 will be described below.

A second electrode 6 is stacked above the organic layer 5 to reflect a shape of the organic layer 5 and has a step in the circumferential portion of the contact hole 9.

In the case of the embodiment, as described above, the upper surface 12a of the filling layer 12 is located below the plane Q including the flat surface 3a of the reflecting layer 3, and the lower surface 5b of the organic layer 5 is located below the plane Q. In other words, the reflecting layer 3 is present on a side of the organic layer 5 inside the contact hole 9 (right and left directions of FIG. 7). For this reason, for example, as shown in FIG. 7, light L emitted in a direction which is close to a true lateral direction from any light emitting point M in the organic layer 5 is reflected by the reflecting layer 3, and thus an angle of a moving direction thereof changes.

FIG. 8 illustrates an example of an optical path of light propagating in an organic layer.

As shown in FIG. 8, light L1 (indicated by a solid arrow) emitted toward an outer edge side of the contact hole 9 from any light emitting point M of the organic layer 5 located above the contact hole 9 is totally reflected at the second electrode 6, is repeatedly reflected between the inclined section 31 of the reflecting layer 3 and the second electrode 6, and then is emitted upward from the upper surface 5a side of the organic layer 5 located in the inclined section 31.

Furthermore, light L2 (indicated by a broken arrow) emitted from any light emitting point N of the organic layer 5 located near the outer edge of the contact hole 9 toward an inside of the contact hole 9 is totally reflected at the flat surface 3a of the reflecting layer 3 and then is emitted upward from the upper surface 5a of the organic layer 5 located above the inclined section 31 of the reflecting layer 3.

The above-described light is normally confined in the organic layer 5 such that it is not emitted to the outside.

On the other hand, in the embodiment, the upper surface 12a of the filling layer 12 is located below the plane Q and the lower surface 5b of the organic layer 5 is located below the plane Q. Furthermore, the inclined section 31 of the reflecting layer 3 located in a circumference of the contact hole 9 is configured to be in contact with the organic layer 5. For this reason, the reflecting layer 3 is present on the side of the organic layer 5 located inside the contact hole 9, and light emitted in a substantially true lateral direction from the light emitting point M in the organic layer 5 is incident on the inclined section 31 of the reflecting layer 3. The light whose moving direction has changed due to reflection at the inclined section 31 is emitted toward a display surface.

As a result, light emitted in a true lateral direction from the light emitting point M can also be extracted to the external space when the light is reflected by the inclined section 31 of the reflecting layer 3 and is incident on an interface between the second electrode 6 and the external space at an angle of incidence which is smaller than a critical angle. Thus, since most of the light emitted from the organic layer 5 into the contact hole 9 can be extracted to the outside, an organic EL device with superior light utilization efficiency compared with the constitution in the related art can be provided.

Numerical apertures (luminance ratios) of constitutions are, for example, as illustrated in [Table 3].

Table 3 illustrates luminance improvement rates of the constitutions with a constant electric current value with respect to the organic EL element of the first embodiment (Example 1) and the organic EL element according to the second embodiment (Example 2) in which the light emitting regions included tops of the contact holes 9 on the basis of the constitutions in the related art of Comparative Example 1 and Comparative Example 2 in which the light emitting regions did not include tops of the contact holes 9. Evaluation items include a different coloring type and a color filter type. Comparison is made using sub-pixels with the same color.

TABLE 3

|  | | First Embodiment | Second Embodiment |
|---|---|---|---|
| Different Coloring Type | FIG. 5B | 1.5 | 1.6 |
| Color Filter Type | FIG. 5D | 1.4 | 1.5 |

As illustrated in Table 3, in the organic EL device (Example 2) according to the second embodiment, the organic layer 5 was configured to be embedded by being inserted inside the contact hole 9 so that light extraction efficiency was improved irrespective of different coloring type or color filter type as compared to the organic EL device (Example 1) according to the first embodiment. In the embodiment, although a proportion of luminance at the circumferential portion of the contact hole with respect to the luminance of the entire contact hole 9 is slight, the luminance of the entire sub-pixel is higher than in the structure of the first embodiment. Note that there is little luminance difference between RGB sub-pixels.

In the above-described first and second embodiment, a cross-sectional shape of the contact hole 9 may be set to a circular arc shape and may be a curved shape with no focal point. In the following embodiment, a constitution in which a contact hole, a cross-sectional shape of which has a curved shape with a focal point is included will be described.

[Third Embodiment]

Next, a constitution of an organic EL device according to a third embodiment will be described.

Although a basic constitution of the third embodiment is substantially the same as that of the second embodiment, the second embodiment and the third embodiment differ in that a cross-sectional shape of a contact hole of the third embodiment is set to a parabolic shape having a curve with a focal point. Thus, in the following description, differences from the second embodiment will be described in detail, and a description of other common constitutions will be omitted.

Figure 9:
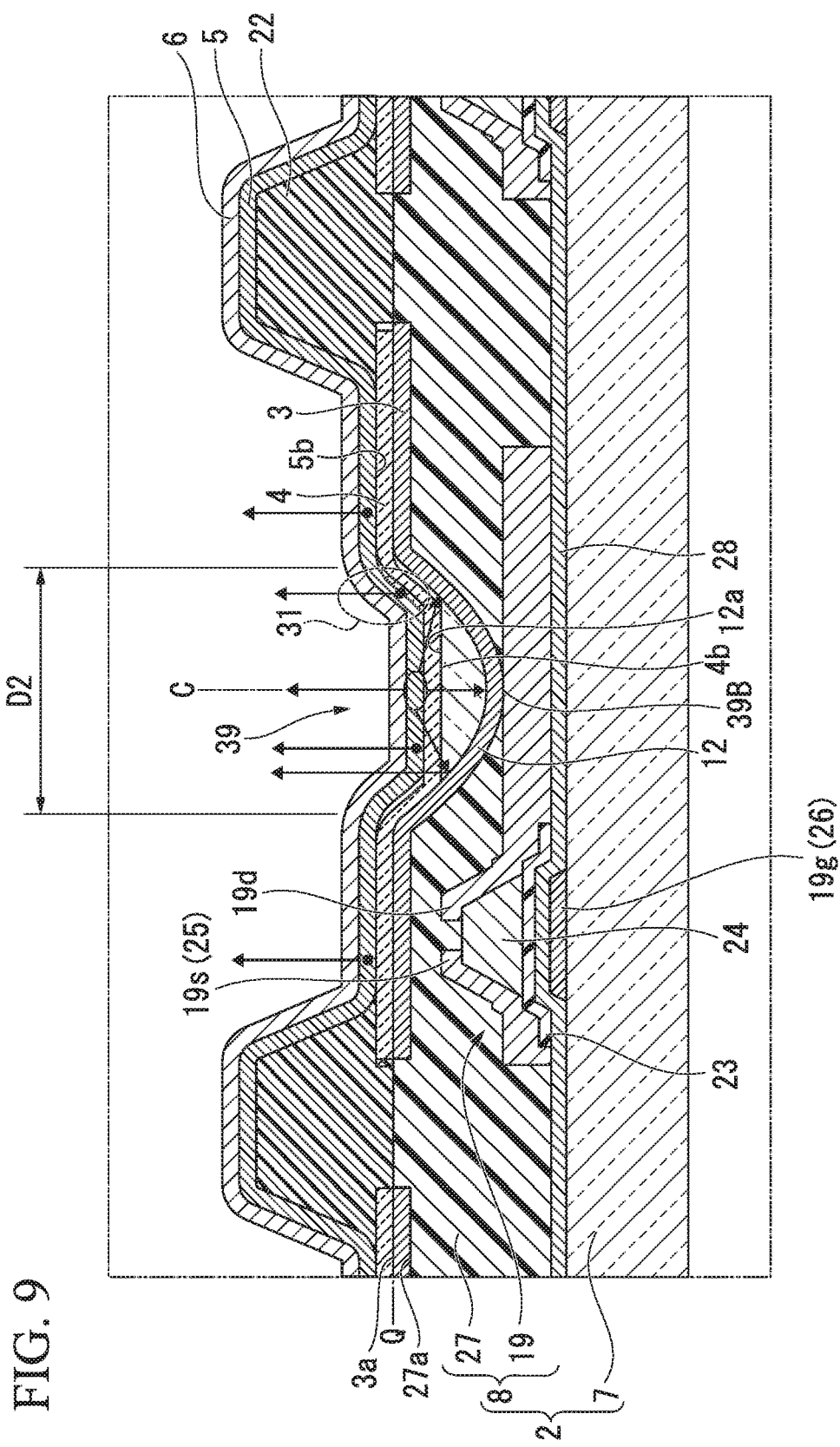
FIG. 9 is a cross-sectional view showing a constitution of a main part of an organic EL device according to a third embodiment.

FIG. 9 is a cross-sectional view showing a constitution of a main part of the organic EL device according to the third embodiment.

In the organic EL device according to the embodiment, as shown in FIG. 9, a cross-sectional circular arc shape of a contact hole 39 is set to a parabolic shape having a curve with a focal point as at least a part thereof.

To be specific, an inner surface of the contact hole 39 is a rotationally symmetric parabola centered on a central axis C which passes through a lowest point 39B of a center of the contact hole 39 and is perpendicular to an upper surface 7a of a substrate 7. Therefore, the cross-sectional shape of the contact hole 39 is the same parabola regardless of a direction of a plane of cutting as long as the cross-sectional shape of the contact hole 39 is a plane which is perpendicular to the upper surface 7a of the substrate 7. A parabolic focal point is located in the organic layer 5 at the center of the contact hole 39.

The contact hole 39 is formed by exposing a resin layer through a half exposure mask pattern. The parabolic shape of the contact hole 39 is obtained through conditions such as an amount of transmitted light, an amount of exposure, and a mask opening size of the half exposure mask pattern. In the embodiment, the parabolic contact hole 39 is formed by setting a diameter of a mask opening size to 4 µm, setting an amount of exposure to 500 mJ/cm$^2$, setting a pattern pitch to 5 µm, and using a photosensitive acrylic resin.

The half exposure mask pattern is a photomask with a predetermined light transmission amount distribution, in which an amount of light transmission near a center of the circular shape pattern is large and an amount of light transmission decreases toward a circumferential portion. Thus, in the resin layer in which the contact hole 39 is formed, the amount of exposure near the center of the circular shape pattern is large and the amount of exposure decreases toward the circumferential portion.

In the organic EL device according to the embodiment, since the parabolic contact hole 39 is provided and the organic layer 5 is provided at a parabolic focal position, an optical path of light reflected by the reflecting layer 3 can be changed to a direction which is substantially perpendicular to the interface between the organic EL device and the external space in contrast to the second embodiment. Since such a parabolic effect improves front luminance and the vicinity of the focal point also contributes to improvement of luminance, an overall light emission luminance can be further increased. As a result, an organic EL device with low power consumption and high luminance can be realized.

In the embodiment, a parabola may be used as a curve with a focal point, but for example, other conical curves with a focal point such as an ellipse and a hyperbolic curve may be used in addition to a parabola. Furthermore, although there are numerous planes which are perpendicular to an upper surface of a substrate, the cross-sectional shape of the contact hole 39 cut at at least one plane includes a curve with a focal point at at least a part thereof. For example, an upper side of the contact hole 39 may be linearly inclined.

Figure 10:
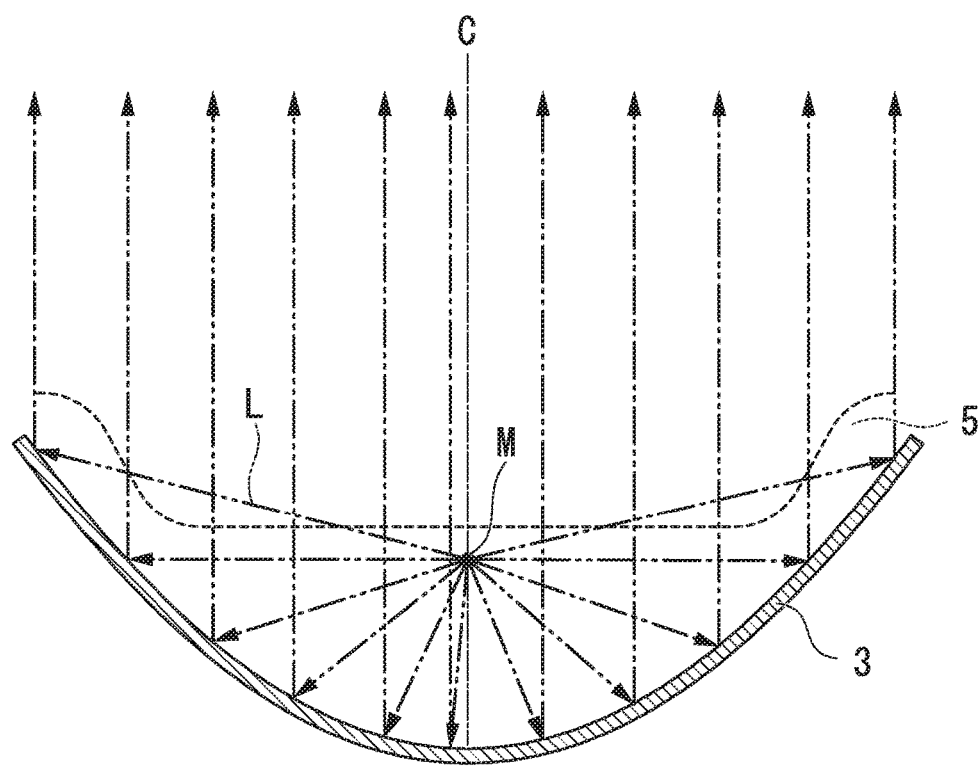
FIG. 10 is a diagram for describing a shape effect of a contact hole according to the third embodiment.

FIG. 10 is a diagram for describing a shape effect of the contact hole according to the third embodiment.

In the case of the embodiment, the reflecting layer 3 is formed along the inner surface of the parabolic contact hole 39, and a surface of the reflecting layer 3 also has a parabolic shape. Furthermore, as described above, the upper surface 12a of the filling layer 12 is located below the plane Q including the flat surface 3a of the reflecting layer 3, and the lower surface 5b of the organic layer 5 is located below the plane Q. Therefore, the reflecting layer 3 is present on the side of the organic layer 5 (right and left directions of FIG. 10). For this reason, for example, light L emitted in a direction which is close to a horizontal direction from any light emitting point M in the organic layer 5 is reflected by the reflecting layer 3, and thus an angle of a moving direction thereof changes.

As shown in FIG. 10, light L emitted from the light emitting point M in the organic layer 5 which is located at a focal point of a parabola serving as the cross-sectional shape of the contact hole 39 is reflected by the reflecting layer 3 and then moves in a direction which is parallel to a central axis C of the parabola, that is, in a direction which is perpendicular to the interface between the organic EL device and the external space. Although light L is emitted from the light emitting point M in all directions, the light L is reflected by the reflecting layer 3 and then moves in the direction which is parallel to the central axis C of the parabola regardless of a direction in which the light L is emitted.

Generally, when a parabola is represented by a quadratic equation in xy coordinates, $y=Ax^2$ is satisfied. At this time, position coordinates of a focal point of the parabola are (0, 1/(4 A)). A position and a parabolic shape of the organic layer 5 may be set such that the focal point is located inside the organic layer 5.

Light emitted from a light emitting point which is away from the focal point of the parabola is also reflected by the reflecting layer 3 and then moves in a direction which is substantially parallel to the central axis C of the parabola, that is, in a direction which is substantially perpendicular to the interface between the organic EL device and the external space. Since light L emitted from the organic layer 5 is reflected by the reflecting layer 3 and then is incident on the interface between the organic EL device and the external space at a sufficiently small angle of incidence, much of the light can be extracted to the external space. Thus, since a light emitting area with low efficiency is eliminated, a low power consumption type display can be accordingly configured.

In order to verify effects of the organic EL device according to the embodiment, the inventors of the present invention prepared the organic EL device according to the first embodiment (Example 1), the organic EL device according to the second embodiment (Example 2), and the organic EL device according to the third embodiment (Example 3) and compared the luminance of pixels thereof.

Specific numerical apertures (luminance ratios) of the constitutions were, for example, as illustrated in [Table 4].

Table 4 illustrates luminance improvement rates of the constitutions with a constant electric current value with respect to the organic EL element of the first embodiment (Example 1), the organic EL element according to the second embodiment (Example 2) in which the light emitting regions included tops of the contact holes 9 and the organic EL element according to the third embodiment (Example 3) in which the light emitting region included tops of the contact holes 39 on the basis of the constitutions in the related art of Comparative Example 1 and Comparative Example 2 in which the light emitting regions did not include tops of the contact holes 9. Evaluation items include a different coloring type and a color filter type. Comparison was made using sub-pixels with the same color.

TABLE 4

|  |  | First Embodiment | Second Embodiment | Third Embodiment |
| --- | --- | --- | --- | --- |
| Different Coloring Type | FIG. 5B | 1.5 | 1.6 | 1.7 |
| Color Filter Type | FIG. 5D | 1.4 | 1.5 | 1.6 |

As illustrated in [Table 4], it was found that a luminance ratio of Example 3 was improved compared to luminance ratios of Example 1 and Example 2. Thus, it was demonstrated that an organic EL device with low power consumption and high luminance could be realized. Note that there is little luminance difference between RGB sub-pixels.

While preferred embodiments of the present invention have been described above with reference to the accompanying drawings, it goes without saying that the present invention is not limited to such examples. Those skilled in the art will appreciate that various modifications or modifications can be conceived within the scope of the technical idea described in the claims, and it is understood that the various modifications or modifications also naturally belong to the technical scope of the present invention.

INDUSTRIAL APPLICABILITY

An aspect of the present invention can be applied to an organic electroluminescence device and the like capable of causing an organic EL element above a contact hole top to emit light.

DESCRIPTION OF THE REFERENCE SYMBOLS 3, 103 Reflecting layer
3a, 5a, 7a, 12a, 14a, 27a Upper surface
4, 104 First electrode
4b, 5b Lower surface
5, 105 Organic layer
6, 106 Second electrode
7 Substrate
9, 39 Contact hole
C Central axis
L, L1, L2 Light
P Pixel
Q Plane
10 Insulating layer
10 Organic EL element
11 (11B, 11G, 11R) Sub-pixel
12, 13 Filling layer
16 Light emitting layer
27 Flattening layer
39B Lowest point

The invention claimed is:

1. An organic electroluminescence device comprising:
a substrate;
a thin film transistor provided above the substrate;
a flattening layer provided above the thin film transistor and including a contact hole which is open on a side opposite to the substrate;
a reflecting layer provided along at least a surface of the contact hole;
a light-transmitting filling layer filling an inside of the contact hole with the reflecting layer therebetween; and
an organic electroluminescence (EL) element defined above the flattening layer and the contact hole, wherein the organic EL element includes:
a first electrode provided at an upper layer side of the light-transmitting filling layer and having optical transparency;
an organic layer provided on an upper layer side of the first electrode and including a light emitting layer; and
a second electrode provided on an upper layer side of the organic layer and having optical transparency and light reflectivity,
the first electrode is electrically connected to the thin film transistor via the reflecting layer, and
an upper surface of the light-transmitting filling layer is located at a same height as or below an upper surface of the flattening layer.

2. The organic electroluminescence device according to claim 1, wherein a cross-sectional shape of the contact hole cut at any plane which is perpendicular to an upper surface of the substrate is a circular arc shape.

3. The organic electroluminescence device according to claim 2, wherein a cross section of the reflecting layer in the contact hole is a rotationally symmetric parabola centered on a central axis which passes through a lowest point at a center of the contact hole and is perpendicular to the upper surface of the substrate.

4. The organic electroluminescence device according to claim 3, wherein a cross-sectional shape of the reflecting layer in the contact hole is a parabolic shape in which a focal point of the parabolic shape is located inside the light emitting layer.

5. The organic electroluminescence device according to claim 1, wherein a lower surface of the organic EL element at a position of the contact hole is located below a surface of the reflecting layer located in a portion other than the contact hole which is opposite to the substrate.

6. The organic electroluminescence device according to claim 1, wherein one pixel is configured by arranging a plurality of sub-pixels including the organic EL element provided above the contact hole top.

7. The organic electroluminescence device according to claim 1, further comprising an edge cover including an open region, wherein
the light-transmitting filling layer is provided, in a plan view, inside the open region.

8. The organic electroluminescence device according to claim 7, wherein the first electrode is, in the plan view, in contact with the reflecting layer inside the open region.

9. The organic electroluminescence device according to claim 1, wherein the first electrode includes a step on an outer circumference of the contact hole, and the first electrode is in contact with the reflecting layer at the step.

10. The organic electroluminescence device according to claim 1, wherein the second electrode includes a step on an outer circumference of the contact hole.

* * * * *